(12) United States Patent
Mauthner et al.

(10) Patent No.: US 7,033,650 B2
(45) Date of Patent: Apr. 25, 2006

(54) METHOD OF PRODUCING A NANOTUBE LAYER ON A SUBSTRATE

(75) Inventors: Klaus Mauthner, Vienna (AT); Xinhe Tang, Vienna (AT); Roland Haubner, Vienna (AT)

(73) Assignee: Electrovac, Fabrikation, Elektrotechnischer Spezialartikel, Gesellschaft mbH, Klosterneuburg (AT)

( * ) Notice: Subject to any disclaimer, the term of this patent is extended or adjusted under 35 U.S.C. 154(b) by 0 days.

(21) Appl. No.: 10/101,650

(22) Filed: Mar. 20, 2002

(65) Prior Publication Data

US 2002/0102353 A1     Aug. 1, 2002

Related U.S. Application Data

(63) Continuation of application No. PCT/AT00/00213, filed on Aug. 3, 2000.

(30) Foreign Application Priority Data

Sep. 29, 1999  (AT) ..................................... 1667/99

(51) Int. Cl.
*D01F 9/127* (2006.01)
*C23C 16/26* (2006.01)
*C23C 16/46* (2006.01)

(52) U.S. Cl. ...................... 427/590; 427/587; 427/591; 427/249.1; 427/903; 118/725; 423/445 B; 423/447.3

(58) Field of Classification Search ................ 427/587, 427/591, 598, 77, 78, 249.1, 249.6, 255.11, 427/255.21, 255.22, 903, 590; 423/445 R, 423/445 B, 448, 447.1, 447.3; 118/725, 118/728; 977/DIG. 1
See application file for complete search history.

(56) References Cited

U.S. PATENT DOCUMENTS

| | | | |
|---|---|---|---|
| 3,892,890 A | | 7/1975 | Watanabe |
| 4,089,992 A | * | 5/1978 | Doo et al. ................... 438/542 |
| 4,173,461 A | * | 11/1979 | Ebata et al. ................... 65/106 |
| 4,525,375 A | * | 6/1985 | Hanak ............................ 427/8 |
| 4,534,312 A | * | 8/1985 | Shinya et al. ................ 118/666 |
| 4,545,368 A | * | 10/1985 | Rand et al. .................... 600/12 |
| 5,165,909 A | * | 11/1992 | Tennent et al. ........... 423/447.3 |
| 5,348,774 A | * | 9/1994 | Golecki et al. ............. 427/543 |
| 5,424,054 A | * | 6/1995 | Bethune et al. ........... 423/447.2 |
| 5,597,611 A | * | 1/1997 | Lennox et al. .............. 427/113 |
| 5,652,030 A | * | 7/1997 | Delperier et al. ............ 427/585 |

(Continued)

FOREIGN PATENT DOCUMENTS

JP     XP-002154696     10/1997

(Continued)

OTHER PUBLICATIONS

Copy of U.S. Provisional Appl. No. 60/203,398, filed on May 11, 2000.*

(Continued)

*Primary Examiner*—Timothy Meeks
*Assistant Examiner*—Wesley D. Markham
(74) *Attorney, Agent, or Firm*—Henry M. Feiereisen; Ursula B. Day

(57) ABSTRACT

In a method of producing a nanotube layer on a substrate by using a CVD process, the substrate is placed in a reaction chamber, which is flushed with a carbon-containing gas. Subsequently, the substrate is heated by an induction process to a temperature at which carbon from the gas phase is deposited on the substrate while forming nanotubes thereon.

35 Claims, 1 Drawing Sheet

U.S. PATENT DOCUMENTS

| | | | | |
|---|---|---|---|---|
| 5,690,997 | A | * | 11/1997 | Grow ..................... 427/249.1 |
| 5,877,110 | A | * | 3/1999 | Snyder et al. .............. 502/180 |
| 5,925,591 | A | * | 7/1999 | Soffer et al. ................ 502/426 |
| 6,645,402 | B1 | * | 11/2003 | Kurokawa et al. .......... 252/502 |
| 2003/0111334 | A1 | * | 6/2003 | Dodelet et al. ............. 204/164 |

FOREIGN PATENT DOCUMENTS

| | | |
|---|---|---|
| JP | 10012364 | 1/1998 |
| WO | WO 98/39250 A1 * | 9/1998 |
| WO | WO 01/85612 A2 * | 11/2001 |

OTHER PUBLICATIONS

Lee et al: Synthesis of uniformly distributed carbon nanotubes on a large area of Si substrates by thermal chemical vapor deposition, in: American Institute of Physics, 1999.

Huang et al: Patterned Growth and Contact Transfer of Well-Aligned Carbon Nanotube Films, in: American Chemical Society 1999.

Cheng et al: Large-scale and low-cost synthesis of single-walled carbon nanotubes by the catalytic pyrolysis of hydrocarbons, in: American Institute of Physics, 1998.

Sen et al: Carbon nanotubes by the metallocene route, in: Chemical Physics Letters, 1997.

Satishkumar et al: Single-walled nanotubes by the pyrolysis of acetylene-organometallic mixtures, in: Chemical Physics Letters, 1008.

* cited by examiner

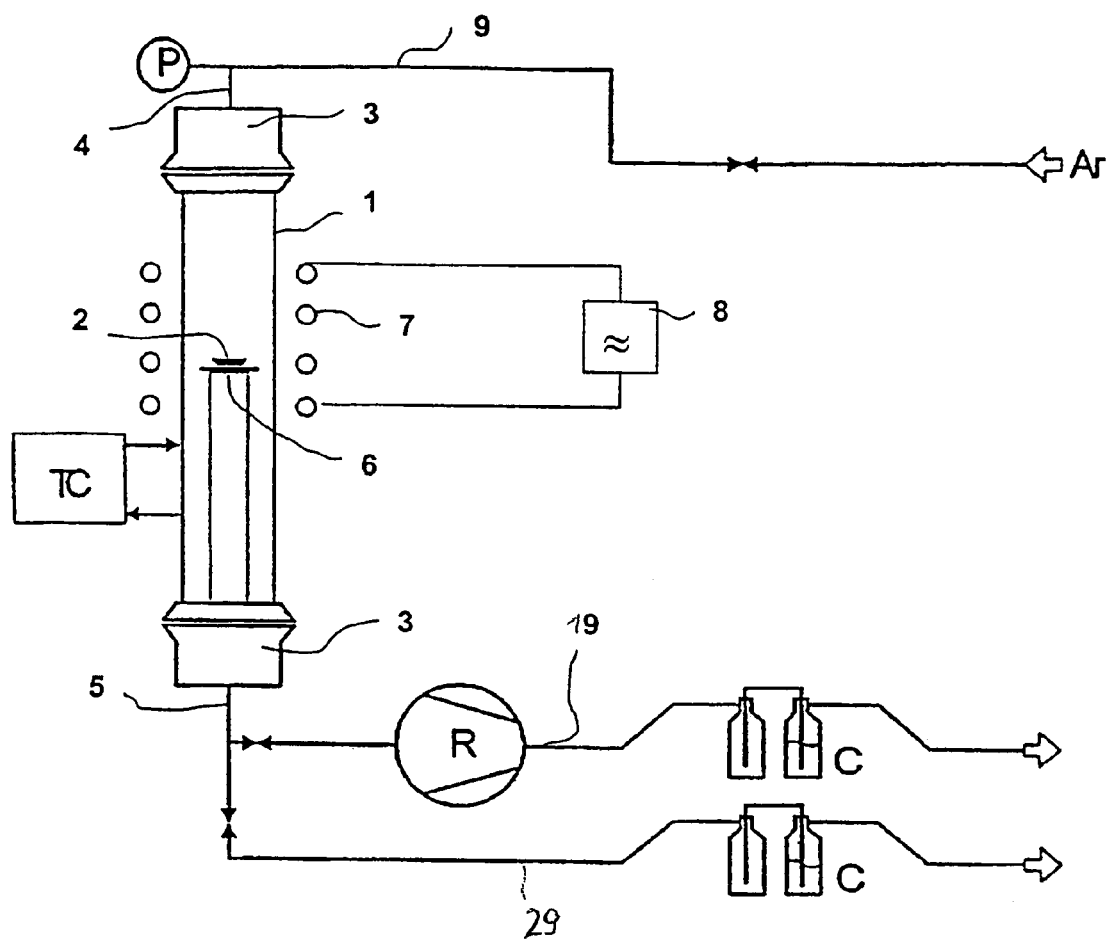

METHOD OF PRODUCING A NANOTUBE LAYER ON A SUBSTRATE

CROSS-REFERENCES TO RELATED APPLICATIONS

This application is a continuation of prior filed copending PCT International application no. PCT/AT00/00213, filed Aug. 3, 2000.

This application claims the priority of Austrian Patent Application Ser. No. A 1667/99, filed Sep. 29, 1999, the subject matter of which is incorporated herein by reference.

BACKGROUND OF THE INVENTION

The present invention relates to a method of producing a nanotube layer on a substrate.

Carbon nanotubes are honeycomb-structured cylindrical tubules of carbon having $sp^2$-structure. Depending on the manufacturing process, distinctions are made between SWNT (Single Wall Nanotubes) or MWNT (Multiwalled Nanotubes). The free-standing ends of the nanotubules are closed under the common synthesis conditions by hemispheres which are realized through inclusion of precisely six pentagonal units in the hexagonal graphite structure. The scientific and, as a result, industrial interest in such nanostructures is based on their superior mechanical and electronic properties. Such structures have a diameter in the nm range and a length up to several μm and find technological application in particular in the field of microelectronics. Currently, great efforts are undertaken to use carbon nanotubes also in the FED-technology.

Although the production of carbon nanotubes has been widely reported, an industrial use of nanotube layers in the emission technology has still not been realized despite many efforts. Various production processes have been proposed including arc discharge at temperatures of about 3000° C., decomposition reactions of SiC wafers at temperatures of 1200° C. under high vacuum, or CVD (chemical vapor deposition) processes, which allow synthesis temperatures for nanotubes even lower than 650° C. Common to all production methods is the term of catalyzed σ-bond metathesis which simply means that the formation mechanism of carbon nanotubes is still speculative. Many experiments confirm catalytic activity in the fullerene/nanotube synthesis of transition metals but also of some elements in the lanthanide group, however, the ideal catalyst or the ideal catalyst composition has not yet been found.

An important issue for technical volume applications of a material is the provision of a reasonable automated process which, especially in the field of microelectronics, should satisfy high clean room conditions.

Nanotube layers are usually produced by separation of carbon atoms from a carbon-containing gas and their deposition on the surface of a substrate. To trigger this decomposition temperature, reaction temperatures in the range between 400 to 2000° C. are needed. However, the actually chosen temperature depends on the substrate material as well as on the used carbon source.

To date, the entire interior of the reaction chamber has to be heated just like a baking oven in order to heat the substrate. This procedure suffers, however, form shortcomings because the heating process does not only affect the substrate but subjects also all other objects placed inside the reaction chamber to heat exposure, in particular the walls of the reaction chamber, so that carbon will deposit thereon as well. As a consequence, undesired carbon deposits contaminate the reaction chamber. Moreover, any energy used for heating objects other than the substrate is considered as loss energy, so that the efficiency of the overall process is adversely affected.

It would therefore be desirable and advantageous to provide an improved method of producing a nanotube layer on a substrate to obviate prior art shortcomings and to substantially reduce formation of undesired carbon layers on objects other than the substrate while significantly reducing heat losses.

SUMMARY OF THE INVENTION

According to one aspect of the present invention, a method of producing a nanotube layer on a substrate by using a CVD process, includes the steps of placing a substrate in a reaction chamber, flushing the reaction chamber with a carbon-containing gas; and heating the substrate by induction to a temperature at which carbon from the gas phase is deposited on the substrate while forming nanotubes thereon.

The present invention resolves prior art problems by limiting the heat exposure to the substrate only to reach a temperature sufficient to trigger a catalytical decomposition and deposition of the carbon atoms thereon. All the other areas of the reaction chamber remain at room temperature and remain substantially unaffected by the heat radiation, which emanates from the substrate and is insufficient to establish a deposit of carbon on other areas of the reaction chamber.

For the first time, the application of a CVD-process is proposed to allow large-area depositing of nanotube films, whereby solely and exclusively the desired and defined surfaces in the reactor are only subject to pyrolysis reactions and resultant carbon deposits. The method according to the present invention ensures the formation of dense, homogeneous carbon nanotube layers at moderate reaction conditions (pressure, temperature), and, since no unintended surfaces in the reactor are exposed to formation of solid deposits from gaseous carbon-containing reactants by pyrolysis, ensures automatization for making bonded components for application in the microelectronics, e.g., FED technology.

According to another feature of the present invention, the substrate in the reaction chamber may be placed on a substrate holder in the form of a plate of electrically conducting material, e.g., metal or graphite, and heating of the substrate is accomplished by induction heating of the substrate holder. Optionally, metal portions of the substrate may also be heated inductively.

Nonmetallic substrates cannot be inductively heated directly because required eddy currents cannot form therein. On the other hand, a metal plate can be heated inductively, so that the provision of such a metal plate in the reaction chamber for placement of a nonmetallic substrate enables application of inductive heating also in connection with nonmetallic substrates, although indirectly through heat transfer from the metal plate onto the substrate. The metal plate may have a relatively small mass so that slight amounts of energy are only required for heating. As other parts of the reaction chamber are not subject to significant heat exposure, the overall energy consumption is significantly reduced.

According to another feature of the present invention, the substrate surface intended for growth of the nanotube layer may be coated with a metal film. In order to realize a deposit of carbon atoms on the substrate surface for nanotube formation, a catalyst should be present on the substrate surface. When being coated with a metal film, the substrate surface already includes such a catalyst, so that a separate process step to apply a catalyst on the substrate is omitted. Moreover, such a metal film can be directly heated inductively.

According to another feature of the present invention, the substrate may be made in its entirety of a metal or metal alloy. Also in this case, the metallic catalyst required for formation of a nanotube layer is already contained on the substrate surface. Moreover, metallic substrates may be directly heated inductively because eddy currents, required for inductive heating, can be generated within the substrate. Thus, the use of metallic substrates allows the provision of nonmetallic substrate holders for receiving the metallic substrates.

According to another feature of the present invention, the substrate may be made of nonmetallic material, e.g. glass, ceramics, silicon, cermet, carbon or the like, wherein a metal-containing catalyst is applied onto the substrate surface capable of nanotube formation, before the reaction chamber is flushed with a carbon-containing gas. In this way, nanotube layers may grow also on nonmetallic substrates. Suitably, the catalyst may be a transition organometallic complex, such as, e.g., ferrocene. These types of substances can be applied easily on the substrate of nonmetallic substrates and catalyze the growth of carbon nanotubes in a particular reliable manner. Ferrocene may hereby be dissolved in acetone. This solution can then be put onto the substrate surface intended for nanotube formation. Once the solvent evaporates, the catalyst is evenly distributed in the form of a microcrystalline layer on the substrate.

According to another feature of the present invention, the carbon-containing gas may be acetylene. In particular in combination with ferrocene as catalyst, acetylene realizes a relatively rapid and reliable deposition process giving a very homogeneous nanotube layer.

It would also be desirable and advantageous to provide an improved apparatus for producing a nanotube layer on a substrate, which obviates prior art shortcomings and substantially reduces formation of undesired carbon layers on objects other than the substrate while significantly reducing heat losses.

According to another aspect of the present invention, an apparatus for producing a nanotube layer on a substrate includes a reaction chamber, a substrate holder therein, and a coil supplied with a.c. voltage which is placed outside the reaction chamber and enclosing the reaction chamber in the area of the substrate holder.

An apparatus according to the present invention is effective and still simple in structure. Existing reaction chambers can easily be equipped therewith. The provision of a coil enables a localized heating of the substrate only for formation of nanotubes, so that other areas of the reaction chamber remain unaffected and no carbon deposits may be formed thereon.

According to another feature of the present invention, the substrate holder may include a plate of electrically conducting material, such as, e.g., metal or graphite. The provision of the substrate holder then allows also the use of nonmetallic substrates. In this case, the substrate holder is directly heated inductively and the generated heat energy is transferred onto the substrate which thus is inductively heated indirectly.

BRIEF DESCRIPTION OF THE DRAWING

Other features and advantages of the present invention will become more readily apparent upon reading the following description of currently preferred exemplified embodiments of the invention with reference to the attached drawing, in which the figure shows a schematic illustration of an apparatus according to the present invention for producing a nanotube layer on a substrate.

DETAILED DESCRIPTION OF PREFERRED EMBODIMENTS

The only figure shows a schematic illustration of an apparatus according to the present invention for producing a nanotube layer on a substrate 2, accomplished by a CVD-process. The apparatus includes a reaction chamber 1 having an interior for placement of the substrate 2. After placement of the substrate 2, the interior of the reaction chamber 1 is flushed with an inert gas, e.g. Ar, and subsequently with a carbon-containing gas, e.g., acetylene, from a suitable, not shown, gas supply, and the substrate 2 is heated to a temperature at which carbon derived from the gas phase deposits on the substrate 2 to form nanotubes.

The actual temperature is depending on the material of the substrate 2 as well as on the type of carbon-containing gas. Of course, one skilled in the field of CVD is capable to easily determine the type of carbon-containing gas as well as the temperature for the growth of nanotubes, so that any suitable carbon-containing gas and appropriate temperature range that generally follows the concepts outlined here is considered to be covered by this disclosure. All carbon-containing gases and organic solvents (various solvents with high carbon content) forming a gaseous phase under reaction conditions can be considered, without departing from the spirit of the present invention. Depending on the selected carbon-containing gas, deposition under reaction temperatures may range between 400 to 2000° C.

The reaction chamber 1 is configured in the shape of a tube made of an insulating material, e.g., quartz and has opposite ends sealed gastight with metal flanges 3. The metal flange 3 on one end includes a gas entry 4, which is connected via a gas tubing 9 to the gas source for incoming gas. The metal flange 3 on the other end includes a gas outlet 5 for feeding and removing gas to and from the reaction chamber 1. Fitted within the reaction chamber 1 is a substrate holder 6 having the shape of a flat plate for placement of the substrate 2. A pressure control unit P at the gas inlet 4 is provided for controlling the gas pressure within the reaction chamber 1, while a pump R is provided to generate the gas stream through the reaction chamber 1 if it is intended to synthesize nanotubes under reduced pressure. The pump R is mounted within a gas tubing 19 which is connected to the gas outlet 5 and contains gas purification units C downstream of the pump R. A second gas tubing 29 branches off the gas outlet 5, parallel to the gas tubing 19 and contains also gas purification units C.

Surrounding the reaction chamber 1 in the area of the substrate holder 6 is a coil 7 having windings which is placed outside around the reaction chamber 1. The coil 7 is connected to an a.c. voltage source 8 so as to build up an alternating magnetic field in the area of the substrate holder 6 and the substrate 2, with the magnetic field penetrating the substrate holder 6 and/or the substrate 2. The formation of this alternating magnetic field results in an inductive heating of the substrate 2. Thus, the change of the magnetic flux results in eddy currents in the substrate 2 and/or in the substrate holder 6. These eddy currents generate heat so that the substrate holder 6 and the substrate 2, directly or indirectly, are heated to a temperature sufficient for growth of nanotubes.

The effect of inductive heating is enhanced as the frequency of the alternating magnetic field increases. It is generally known that the magnitude of an induced voltage, and thus the magnitude of the (heating) current resultant from the voltage, is directly proportional to the frequency of the alternating magnetic field. The a.c. voltage source 8 is thus suitably a high-frequency voltage source for supplying frequencies of above 1 kHz.

Whether eddy currents are induced only in the substrate 2, or only in the substrate holder 6 or in both substrate 2 and substrate holder 6, depends on the electric properties of these components. Nanotubes may grow on metallic substrates as well as on nonmetallic substrates, so that the substrate 2 may be conductive as well as non-conductive. In case of the substrate 2 is made of metal, or is nonmetallic but provided with a metal coating, eddy currents are generated in the substrate 2 or at least in the metal coating. Thus, such a substrate 2 can be inductively heated directly. The material of the substrate holder 6 can then be selected randomly and thus may be made of non-metal, e.g., ceramics. The material for providing metallic substances may be any pure metals or metal alloys.

Unlike substrates made of metal or coated with a metallic film, a nonmetallic substrate can only be inductively heated indirectly, in which case the substrate holder 6 is made of a plate of electrically conducting material, such as, e.g., metal or graphite and used for placement of the substrate 2 thereon. The alternating magnetic field generated by the coil 7 generates hereby eddy currents only within the plate, whereby the resultant heat is then transmitted to the substrate 2.

Regardless whether the substrate 2 is metallic or nonmetallic, the substrate holder 6 may be made of metal so that in the event the substrate 2 as well as the substrate holder 6 are made of metal. Thus, both of these components are directly heated inductively.

The temperature for the actually used substrate 2 and the actually used carbon-containing gas is regulated by a temperature control TC which is so constructed in order to measure the actual substrate temperature and to set the a.c. voltage source 8 accordingly. Control of the a.c. voltage source 8 may be carried out in various ways, ranging from a simple ON-OFF switching of the a.c. voltage source 8 (dual mode control) to a steady change of parameters (voltage and/or frequency) of the a.c. voltage source.

As carbon from the carbon-containing gas deposits on the substrate surface only in the presence of a suitable metal-containing catalyst on the substrate surface, the use of a nonmetallic substrate 2 requires the application of such a metal-containing catalyst on the substrate surface provided for growth of nanotubes, before the reaction chamber 1 is flushed with carbon-containing gas. Examples of metal-containing catalysts include both metallic films, e.g., Fe, Co, Ni, Cr, Mo, Cu, Ru, Rh, Pd, Pt, and metallocenes and transition organometallic complexes, such as, e.g., ferrocene. Application of the catalyst may be implemented through impregnation of substrates with porous surfaces through placement of these substrates in concentrated metal complex solutions. Conditions for impregnation (solvent, temperature, concentration) are dependent on the chemical properties of the used metal complex. Porous surfaces may be realized through simple etching techniques, e.g., exposure to acids, anodic oxidation or by the substrate itself.

Persons skilled in the art will appreciate that the precise overall execution of the CVD process may alter within frame conditions. There are many ways, for example, to prepare the substrate 2, to carry out the intended flushing of the reaction chamber 1 with purging gases, and to carry out the final cooling of the substrate 2, only several of which are detailed here. Thus, all embodiments which generally follow the concepts outlined here are considered to be covered by this disclosure.

EXAMPLE

The following description refers, as a particular example, to the growth of a nanotube layer on a glass substrate. The reaction chamber 1 is formed by a quartz tube with a length of 80 cm and a diameter of 8 cm. Metal caps 3 seal the end faces of the quartz tube and include the gas inlet 4 and the gas outlet 5, respectively. The substrate 2 is a plate of PYREX® glass (borosilicate glass) of a size of 4 cm×2 cm×0.125 cm. The plate is roughened with corundum powder to provide a better distribution of ferrocene catalyst precursor on the glass plate. Ferrocene is dissolved in acetone and a few drops of the saturated acetone solution are put on the substrate surface. Acetone slowly evaporates, giving a microcrystalline ferrocene film on the substrate surface.

Subsequently, the thus prepared glass substrate 2 is placed on the substrate holder 6, which is made of molybdenum and placed inside the reaction chamber 1. The reaction chamber 1 is then flushed with nitrogen for 15 min. Thereafter, acetylene is introduced as carbon-containing carrier gas into the reaction chamber 1, providing a suitable atmosphere for the CVD process. The gas stream of acetylene is introduced at a flow rate of about 15 sccm $min^{-1}$. The substrate 2 is then heated as rapidly as possible to a temperature of 650° C. by inductive heating by means of the coil 7 applying an a.c. voltage of 2 kV with a current of 0.65 mA.

After few seconds, ferrocene vapor forms above the substrate as a result of partial sublimation of this type of catalyst. As the ferrocene vapor is slowly moved by the gas stream of acetylene to the substrate surface, it is decomposed forming nm sized particles on the substrate surface, which in turn catalyze the nanotube growth. The beginning of this nanotube growth can be recognized by the formation of a homogenous black layer on the substrate surface.

The afore-mentioned process conditions (flushing with acetylene and heating of the substrate to 650° C.) are maintained for 40 minutes. Subsequently, the substrate provided with the nanotube layer is cooled down to room temperature by means of a gas stream of nitrogen.

Scanning electron microscopy (SEM) has been used to examine the morphology of the carbon nanotubes produced by the method according to the present invention. Isolated, straight nanotube bundles in the range of micrometers in length as well as curved single nanotubes of a few hundred micrometers long have been observed. The single nanotubes as well as the nanotube bundles have iron particles on their tips. The mean diameter of the single nanotubes is about 130 nm. This is remarkably large compared to diameters reported in the literature and can be explained by the size of the iron particles on the glass substrate under the conditions applied in this particular experiment.

While the invention has been illustrated and described as embodied in a method of producing a nanotube layer on a substrate, it is not intended to be limited to the details given since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as they are suited to the particular purpose.

What is claimed as novel and desired to be protected by Letters Patent is set forth in the appended claims and their equivalents.

What is claimed is:

1. A method of producing a nanotube layer on a substrate by using a catalytic CVD process, comprising the steps of:
providing a substrate having a catalyst on the surface,
placing the substrate in a reaction chamber,
flushing the reaction chamber with a carbon-containing gas or carbon containing vapor existing in a gas phase; and
heating said catalyst on the surface of the substrate by using induction heating to a temperature at which carbon from the gas phase is deposited on the substrate while forming nanotubes thereon, wherein the heating step includes direct inductive heating of a catalytically active metal coating on a surface of the substrate.

2. The method of claim 1, wherein the substrate is placed in the reaction chamber on a substrate holder in the form of a plate being an electrically conducting material, wherein the heating step is achieved by inductive heating of said plate.

3. The method of claim 2, wherein the plate is made of metal or graphite.

4. The method of claim 3, wherein the plate is made of molybdenum.

5. The method of claim 2, wherein the substrate is made of a nonmetallic material, and further comprising the step of applying a metal-containing catalyst onto the substrate surface before flushing the reaction chamber with a carbon-containing gas.

6. The method of claim 5, wherein ferrocene is applied onto the substrate surface in solution.

7. The method of claim 2, wherein the substrate is a nonmetallic material selected from the group consisting of glass, ceramics, silicon, cermet, and carbon.

8. The method of claim 7, wherein the catalyst on the surface is ferrocene.

9. The method of claim 8, wherein ferrocene is applied onto the substrate surface in solution.

10. The method of claim 1, wherein the catalyst is ferrocene.

11. The method of claim 1, wherein the substrate undergoes an etching treatment, in order to provide a defined surface morphology before deposition of the catalyst thereon.

12. The method of claim 1, wherein the carbon-containing gas is acetylene.

13. The method of claim 1, wherein the substrate is heated to a temperature between 400 and 2000° C.

14. The method of claim 1, wherein the substrate is heated to a temperature of 650° C. by inductive heating realized by applying an a.c. voltage of 2 kV at a current of 0.65 mA.

15. The method of claim 1, wherein the flushing and heating steps are carried out for 40 minutes.

16. The method of claim 1, wherein the catalyst is a metallocene or a transition organometallic complex.

17. The method of claim 16, wherein the metallocene or the transition organometallic complex comprises at least one of Fe, Co, Ni, Cr, Mo, Cu, Ru, Rh, Pd. Pt.

18. The method of claim 17, wherein the transition metals are Fe, Ca or Ni.

19. The method of claim 1, wherein the substrate provides a porous structure is made of a borosilicate glass and has a surface prepared for growth of nanotubes, and further comprising the steps of roughening the substrate surface and applying a catalyst on the substrate surface.

20. A method of producing a nanotube layer on a substrate by using a catalytic CVD process, comprising the steps of:
providing a substrate having a catalyst on the surface,
placing the substrate in a reaction chamber,
flushing the reaction chamber with a carbon-containing gas or carbon containing vapor existing in a gas phase; and
heating said catalyst on the surface of the substrate by using induction heating to a temperature at which carbon from the gas phase is deposited on the substrate while forming nanotubes thereon, wherein the substrate is made of catalyst metal or alloy thereof and heated directly by inductive heating.

21. The method of claim 20, wherein the carbon-containing gas is acetylene.

22. The method of claim 20, wherein the substrate is heated to a temperature between 400 and 2000° C.

23. The method of claim 20, wherein the substrate is heated to a temperature of 650° C. by inductive heating realized by applying an a.c. voltage of 2 kV at a current of 0.65 mA.

24. The method of claim 20, wherein the hushing and heating steps are carded out for 40 minutes.

25. The method of claim 20, wherein the catalyst comprises at least one of Fe, Co. Ni, Cr, Mo, Cu, Ru, Rh, Pd, Pt.

26. The method of claim 25, wherein the transition metals are Fe, Co or Ni.

27. A method of producing a nanotube layer on a substrate by using a catalytic CVD process, comprising the steps of:
providing a substrate having a catalyst on the surface,
placing the substrate in a reaction chamber,
flushing the reaction chamber with a carbon-containing gas or carbon containing vapor existing in a gas phase; and
heating said catalyst on the surface of the substrate by using induction heating to a temperature at which carbon from the gas phase is deposited on the substrate while forming nanotubes thereon, wherein the substrate is made in its entirety of a metal or metal alloy.

28. The method of claim 27, wherein the substrate is placed in the reaction chamber on a substrate holder in the form of a plate being an electrically conducting material, wherein the heating step is achieved by inductive heating of said plate.

29. The method of claim 28, wherein the plate is made of molybdenum.

30. The method of claim 27, wherein the carbon-containing gas is acetylene.

31. The method of claim 27, wherein the substrate is heated to a temperature between 400 and 2000° C.

32. The method of claim 27, wherein the substrate is heated to a temperature of 650° C. by inductive heating realized by applying an a.c voltage of 2 kV at a current of 0.65 mA.

33. The method of claim 27, wherein the flushing and heating steps are carried out for 40 minutes.

34. A method, comprising the steps of:
placing a nonmetallic substrate on a metallic holder in a reaction chamber,
flushing the reaction chamber with a carbon-containing gas; and heating the substrate holder by inducing electric current by induction to a temperature sufficient to allow carbon from the gas phase to deposit on the substrate while forming nanotubes thereon, wherein the substrate is made of a borosilicate glass and has a surface prepared for growth of nanotubes, and further comprising the steps of roughening the substrate surface and applying a catalyst on the substrate surface.

35. A method of producing a nanotube layer on a substrate by using a CVD process, comprising the steps of:

placing a substrate in a reaction chamber, flushing the reaction chamber with a carbon-containing gas; and heating the substrate by induction to a temperature at which carbon from the gas phase is deposited on the substrate while forming nanotubes thereon, wherein the substrate is made in its entirety of a metal or metal alloy.

* * * * *

UNITED STATES PATENT AND TRADEMARK OFFICE
CERTIFICATE OF CORRECTION

PATENT NO. : 7,033,650 B2
APPLICATION NO. : 10/101650
DATED : April 25, 2006
INVENTOR(S) : Klaus Mauthner et al.

It is certified that error appears in the above-identified patent and that said Letters Patent is hereby corrected as shown below:

<u>Cover page,</u>
(73) Assignee: change "Electrovac, Fabrikation, Elektrotechnischer Spezialartikel, Gesellschaft mbH" to --Electrovac, Fabrikation elektrotechnischer Spezialartikel Gesellschaft mbH--.

<u>Column 7,</u> line 67: change "Ca" to --Co--

<u>Column 8,</u> line 2: change "structure is" to --structure, is--

<u>Column 8,</u> line 27 change "hushing" to --flushing--

<u>Column 8,</u> line 28 change "carded" to --carried--

<u>Column 8,</u> line 30 change "Co." to --Co,--

Signed and Sealed this

Eleventh Day of July, 2006

JON W. DUDAS
*Director of the United States Patent and Trademark Office*